United States Patent [19]
Akiyama et al.

[11] Patent Number: 5,808,493
[45] Date of Patent: Sep. 15, 1998

[54] RATIONAL FREQUENCY DIVISION DEVICE AND FREQUENCY SYNTHESIZER USING THE SAME

[75] Inventors: Norihiro Akiyama, Atsugi; Hirokazu Yanagawa, Hiratsuka; Hatsuo Motoyama, Machida, all of Japan

[73] Assignee: Anritsu Corporation, Tokyo, Japan

[21] Appl. No.: 809,022

[22] PCT Filed: Jul. 30, 1996

[86] PCT No.: PCT/JP96/02143

§ 371 Date: Mar. 12, 1997

§ 102(e) Date: Mar. 12, 1997

[87] PCT Pub. No.: WO97/06600

PCT Pub. Date: Feb. 20, 1997

[30] Foreign Application Priority Data

Aug. 3, 1995 [JP] Japan .................................. 7-198653

[51] Int. Cl.$^6$ ........................................................ H03L 7/06
[52] U.S. Cl. ........................ 327/159; 327/115; 327/117; 327/156; 327/158
[58] Field of Search ................................. 327/115, 117, 327/156, 158, 159

[56] References Cited

U.S. PATENT DOCUMENTS

| | | | |
|---|---|---|---|
| 3,913,028 | 10/1975 | Bosselaers | 327/159 |
| 3,928,813 | 12/1975 | Kingsford-Smith | 331/1 A |
| 4,546,331 | 10/1985 | DaSilva et al. | 332/19 |
| 5,038,117 | 8/1991 | Miller | 331/16 |
| 5,305,362 | 4/1994 | Miller | 377/48 |
| 5,602,884 | 2/1997 | Wieczorkiewicz et al. | 327/159 |
| 5,694,068 | 12/1997 | Rokugo | 327/159 |

FOREIGN PATENT DOCUMENTS

| | | |
|---|---|---|
| 4-212522 | 8/1992 | Japan . |
| 6-244721 | 9/1994 | Japan . |
| 7-61011 | 6/1995 | Japan . |

*Primary Examiner*—Margaret Rose Wambach
*Attorney, Agent, or Firm*—Frishauf, Holtz, Goodman, Langer & Chick

[57] ABSTRACT

A rational frequency division device eliminates spurious components by a simple arrangement and can set a broad frequency modulation range. A frequency synthesizer using the rational frequency division device includes an arithmetic circuit, which outputs the frequency division ratio to a frequency divider in a PLL circuit constituted by a variable frequency oscillator 4, a frequency divider 6, and a phase detector 2. The arithmetic circuit includes a plurality of series-connected cumulative adders 22 which include a first cumulative adder that receives a rational number defined by an integer value and a decimal value, an integer value extraction circuit 23 for extracting an integer value from the output value of the cumulative adder of the final stage, and a delay circuit 24 for outputting the integer value extracted by the integer value extraction circuit to the frequency divider as the frequency division ratio, and outputting the integer value to the respective cumulative adders as a feedback value. Each cumulative adder adds a value calculated by itself in the previous clock period to the input rational number or the output value from the cumulative adder of the previous stage, and subtracts the feedback value from the delay circuit therefrom, thus outputting the calculated value.

13 Claims, 10 Drawing Sheets

I: INTEGER VALUE    J: DECIMAL VALUE

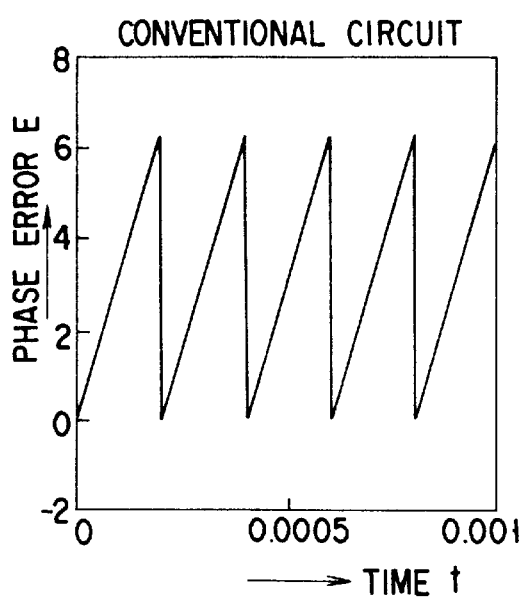
F I G. 4A
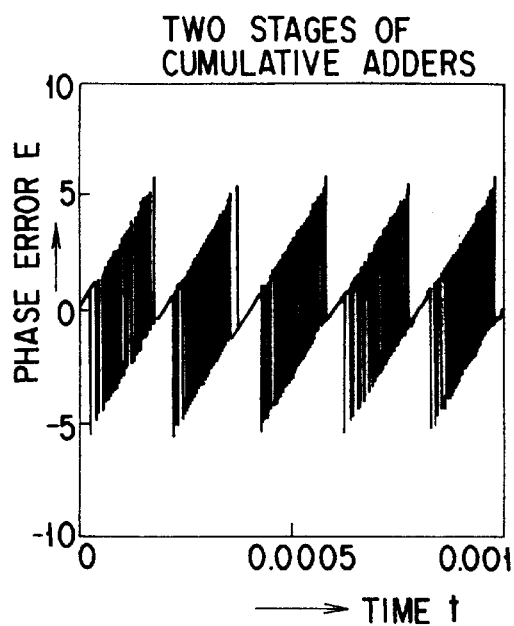
F I G. 4B
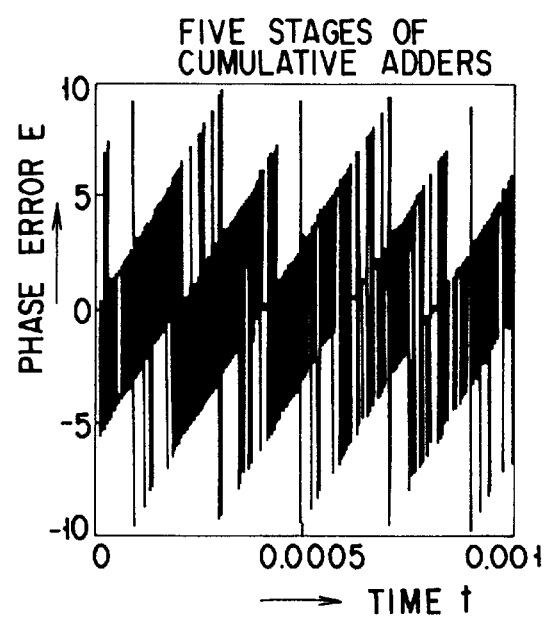
F I G. 4C

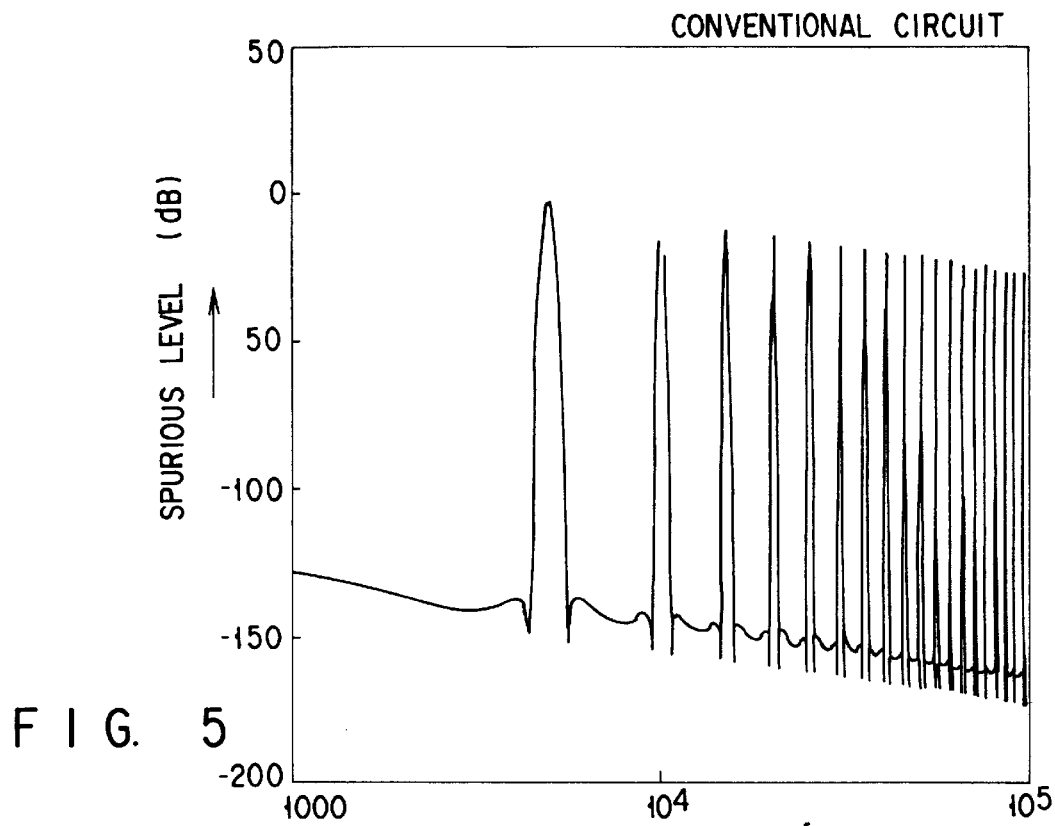
F I G. 5
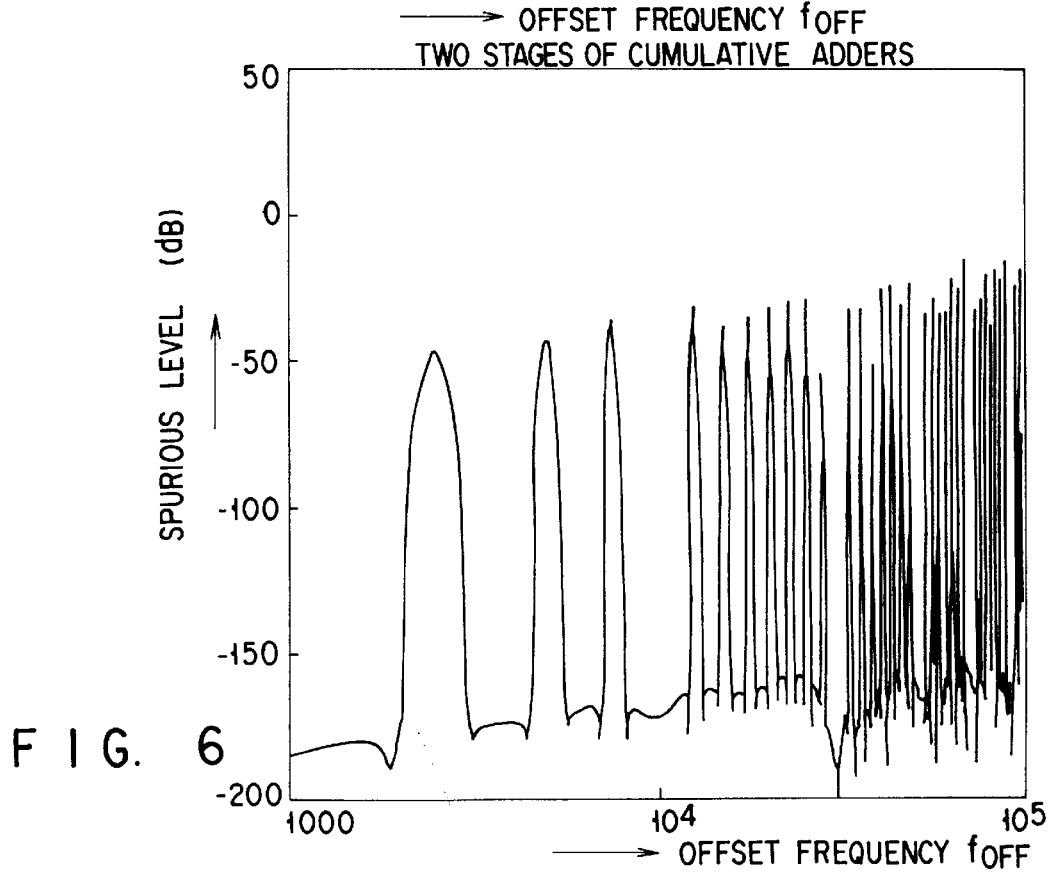
F I G. 6

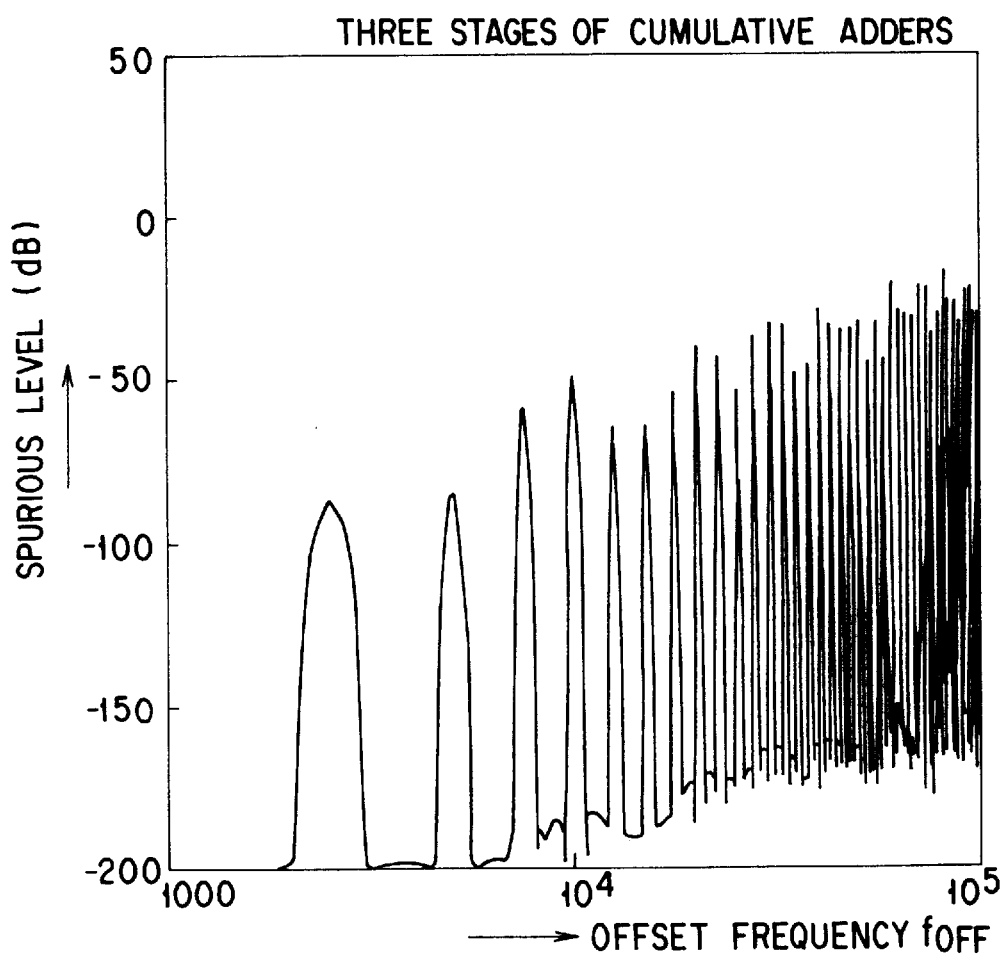
F I G. 7

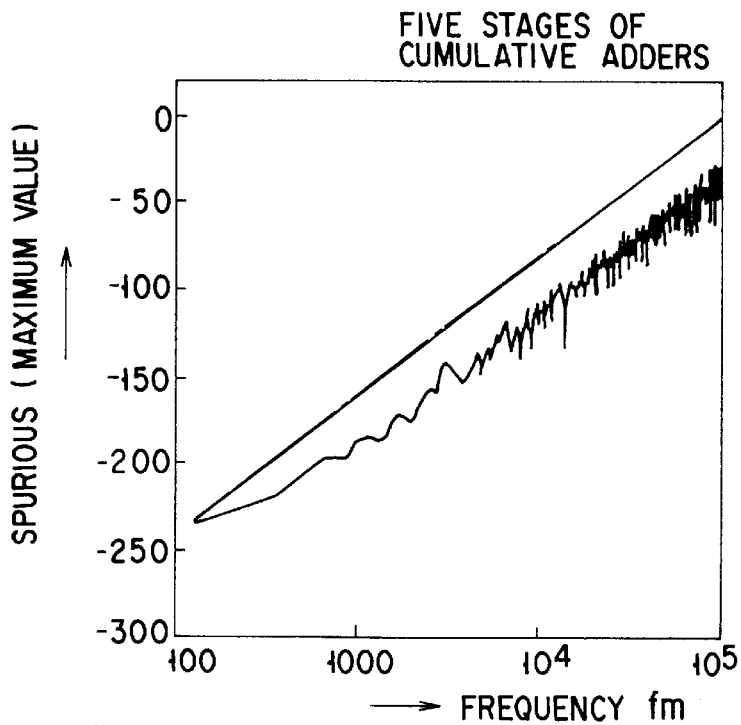
F I G. 8A
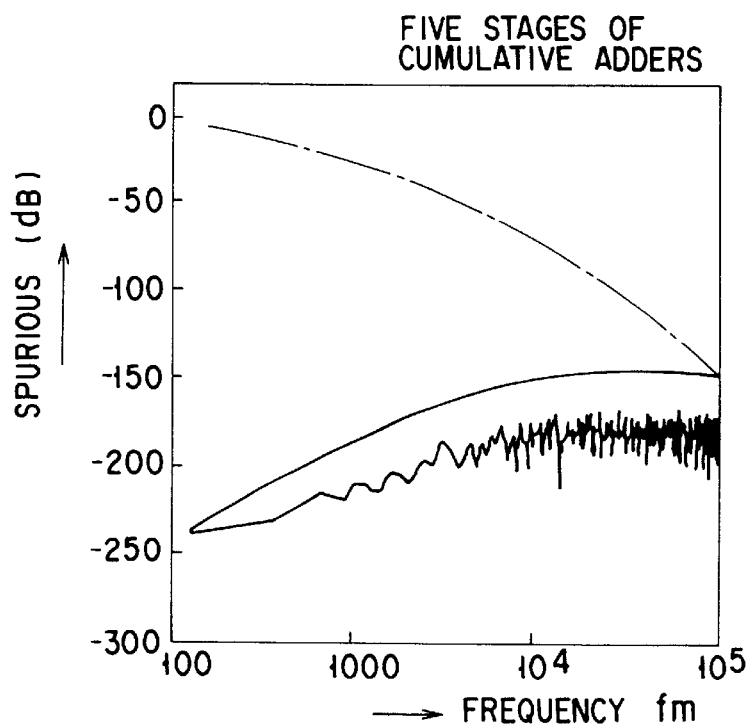
F I G. 8B

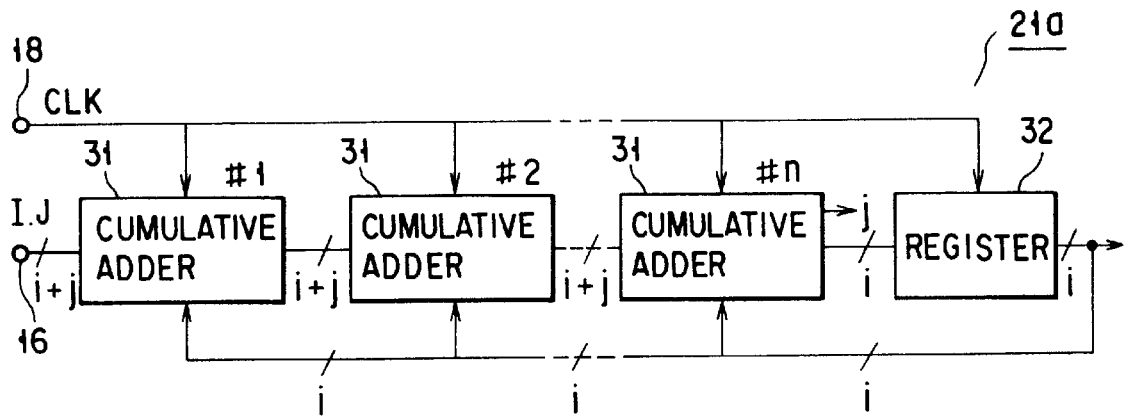
F I G. 9
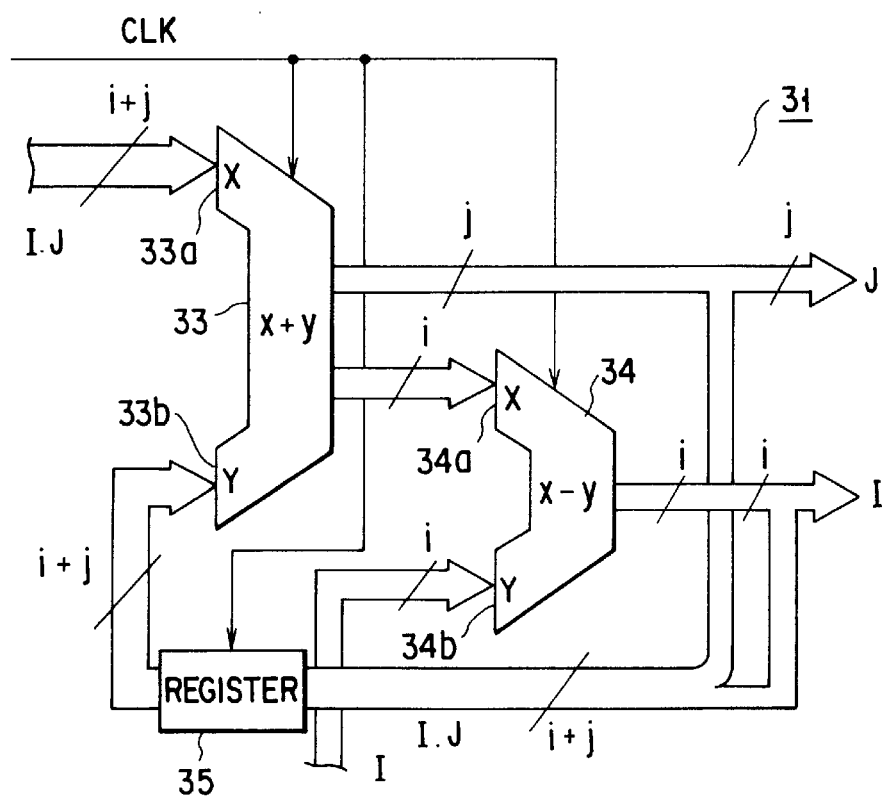
i : NUMBER OF BITS OF INTEGER VALUE
j : NUMBER OF BITS OF DECIMAL VALUE
F I G. 10 i : NUMBER OF BITS OF INTEGER VALUE
j : NUMBER OF BITS OF DECIMAL VALUE $f_{out} = (N.J) f_{ref}$  N: INTEGER
J: BELOW DECIMAL POINT

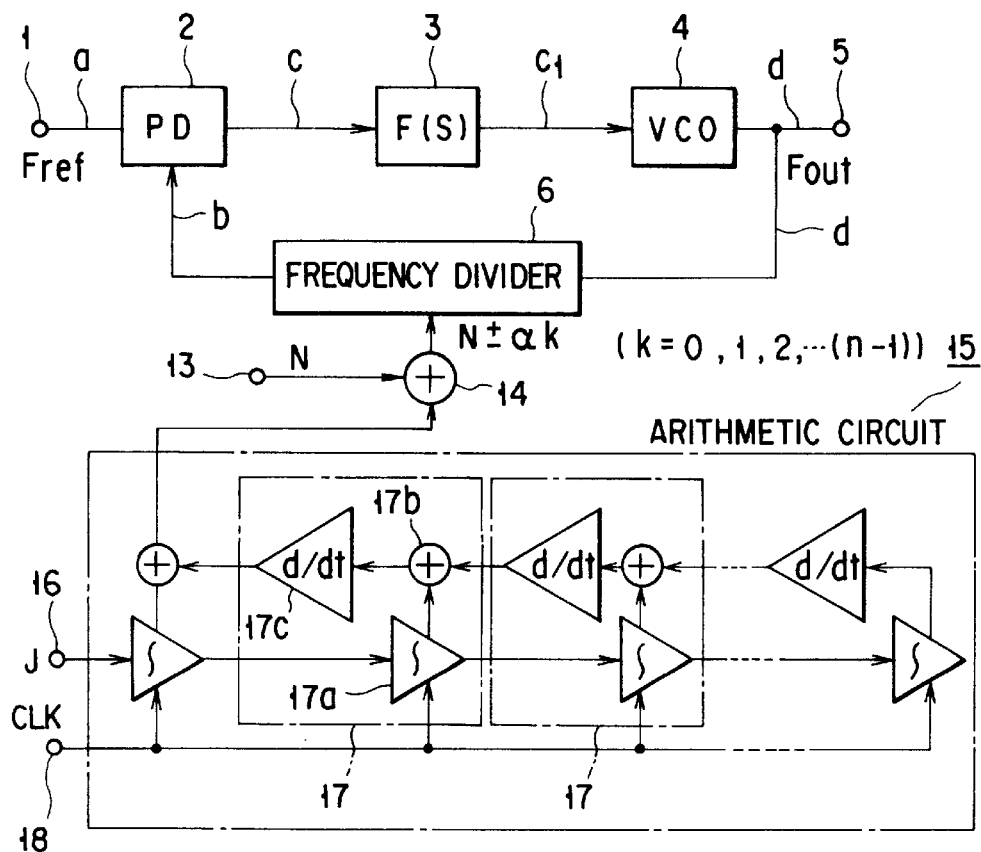
F I G. 16
$$f_{out} = (N \cdot J + \Delta J) \cdot f_{ref}, \quad \begin{pmatrix} J + \Delta J : \text{BELOW DECIMAL POINT} \\ 0 < J + \Delta J < 1 \end{pmatrix}$$
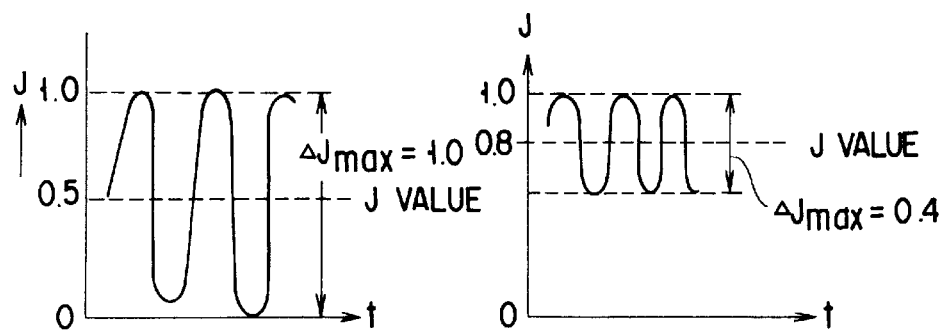
F I G. 17A    F I G. 17B

RATIONAL FREQUENCY DIVISION DEVICE AND FREQUENCY SYNTHESIZER USING THE SAME

TECHNICAL FIELD

The present invention relates to a rational number (rational) frequency division device and a frequency synthesizer using the same and, more particularly, to a rational frequency division device that can input an arbitrary rational number value and a frequency synthesizer that can output an output frequency signal corresponding to a non-integer multiple of a reference frequency with low spurious level using the rational frequency division device.

BACKGROUND ART

As is well known, a frequency synthesizer using a phase locked loop (PLL) circuit has a basic arrangement, as shown in FIG. 13 (note that the frequency division ratio to be input to a frequency divider 6 is only N (N: an integer)).

More specifically, in FIG. 13, a reference frequency signal a having a reference frequency $f_{ref}$ input from an input terminal 1 is input to a phase detector 2.

The phase detector 2 detects the phase difference between the reference frequency signal a and a frequency-divided signal b output from the frequency divider 6, and outputs a phase difference signal c having a voltage proportional to the phase difference.

The phase difference signal c output from the phase detector 2 is input to a loop filter 3 to remove its high-frequency component, and thereafter, is input as a new phase difference signal $c_1$ to a voltage-controlled oscillator (VCO) 4.

The VCO 4 outputs an output frequency signal d having an output frequency $f_{out}$ corresponding to the signal value of the phase difference signal $c_1$ to an output terminal 5.

Also, the output frequency signal d output from the VCO 4 is input to the frequency divider 6.

The frequency divider 6 divides the frequency of the output frequency signal d by an externally input frequency division ratio N (N: an integer), and supplies the result to the phase detector 2 as the frequency-divided signal b.

In such frequency synthesizer using the PLL circuit, the output frequency $f_{out}$ of the output frequency signal d output from the output terminal 5 is N times the reference frequency $f_{ref}$, as described by the following equation:

$$f_{out}=N \cdot f_{ref}$$

In this equation, since N is an integer, the output frequency $f_{out}$ of the basic arrangement of the frequency synthesizer using the PLL circuit, as shown in FIG. 13, can only assume values corresponding to integer multiples of the reference frequency $f_{ref}$.

When a low reference frequency $f_{ref}$ is set to decrease the step size of the output frequency $f_{out}$, a problem of deterioration of the loop response characteristics of the PLL circuit or the like is posed.

In order to output an output frequency signal corresponding to a non-integer multiple of the reference frequency, a frequency synthesizer that adopts a fractional N scheme for obtaining the output frequency $f_{out}$ corresponding to a rational multiple of the reference frequency $f_{ref}$ has been proposed by U.S. Pat. No. 3,928,813.

More specifically, in the frequency synthesizer based on the fractional N scheme, the frequency division ratio to be set in the frequency divider 6 in the frequency synthesizer using the PLL circuit, as shown in FIG. 13, is switched from N to (N+1) at predetermined periods, as shown in FIG. 14.

For example, if the frequency division ratio N to be set in the frequency divider 6 is replaced by a frequency division ratio (N+1) at a rate of once in ten times, the output frequency $f_{out}$ as a whole assumes a value not N times but [N·1] times the reference frequency $f_{ref}$.

In this way, according to the frequency synthesizer based on the fractional N scheme, the output frequency $f_{out}$ corresponding to an arbitrary rational value [N·J] multiple of the reference frequency $f_{ref}$ is obtained, as defined by the following equation:

$$f_{out}=[N \cdot J] \cdot f_{ref}$$

In this equation, N is an integer value, and J is a decimal value (a value below the decimal point) called a fractional value.

In the above-mentioned frequency synthesizer based on the fractional N scheme using the PLL circuit, when frequency modulation is performed in the PLL circuit, a modulation signal e having a frequency $f_m$ may be applied from an input terminal 8 to the input stage of the VCO 4 via a signal multiplexer 7, as shown in FIG. 15.

However, with this frequency modulation method, frequency modulation of direct current (DC) components and in the frequency band cannot be made due to low-frequency attenuation characteristics in the PLL frequency band.

In order to solve such problem, as indicated by broken lines in FIG. 15, a voltage obtained by integrating a modulation wave on the output from the phase detector 2 by an integrator 9 may be applied.

However, with this method, since the output from the integrator 9 is saturated, modulation up to direct current (DC) components cannot be performed.

In order to solve this problem, a method of preventing the integrator from being saturated by changing the frequency division ratio of the frequency divider 6 has been proposed by U.S. Pat. No. 4,546,331.

However, even in the frequency synthesizer that uses the PLL circuit shown in FIG. 13 and adopts the fractional N scheme, the following problems remain unsolved.

That is, in this fractional N scheme, since the frequency division value of the frequency divider 6 is instantaneously N or (N+1), phase errors occur between the reference frequency signal a for the phase detector 2 and the frequency-divided signal b even when the PLL circuit is locked.

As a consequence, when the phase errors are periodically mixed in the phase difference signal c, since the phase difference signal c ($c_1$) mixed with periodic phase difference errors is input to the VCO 4, fractional spurious components that are hard to remove are generated in the neighborhood of the carrier frequency in the output frequency signal d output from the VCO 4.

FIG. 3A shows the instantaneous value of the decimal part of the frequency division ratio (N, N+1) set in the frequency divider 6.

FIG. 4A shows phase errors E between the reference frequency signal a at the input stage of the phase detector 2, and the frequency-divided signal c.

More specifically, such phase errors E are superposed on the phase difference signal c, and the superposed signal is input to the VCO 4.

FIG. 5 shows the spurious level with respect to an offset frequency $f_{OFF}$ from the carrier frequency, which is plotted along the abscissa.

Note that the characteristic values shown in FIGS. 3A, 4A, and 5 are obtained by calculating, by a simulation method, the operation of the frequency synthesizer that adopts the fractional N scheme shown in FIG. 13, when the clock frequency is set to be 500 kHz, and the rate of replacing the frequency division ratio N by the frequency division ratio (N+1) is set to be once in a thousand times.

In this way, in the fractional spurious characteristics shown in FIG. 5, it is seen that large peak values with high levels are generated in the neighborhood of the carrier at predetermined frequency intervals.

On the other hand, when the frequency modulation method disclosed in U.S. Pat. No. 4,546,331 above is used, many additional circuits and complicated control are required.

In order to solve problems unique to such frequency synthesizer adopting the fractional N scheme, a frequency synthesizer that adopts a multiple modulator fractional N scheme, as shown in FIG. 16, has been proposed by U.S. Pat. No. 5,038,117.

In this multiple modulator fractional N scheme, the frequency division ratio to be set in the frequency divider 6 is a value obtained by adding an integer value N input via an input terminal 13 and an integer modulation value $\alpha_k$ (k=0, 1, 2, 3, . . . , n−1) output from an arithmetic circuit 15 by an adder 14.

In this case, the arithmetic circuit 15 outputs, as the integer modulation value $\alpha_k$ (k=0, 1, 2, 3, . . . , n−1), a value obtained by cumulating a decimal value J (1<J<0) input from an input terminal 16 in turn by n series-connected modulation circuits 17.

Each modulation circuit 17 is constituted by a cumulative adder 17a for cumulating the decimal value J in synchronism with a clock signal CLK input from a clock terminal 18, and outputting an overflow signal when the cumulative value has exceeded a value [1], an adder 17b, and a differentiator 17c.

In the frequency synthesizer adopting the multiple modulator fractional N scheme with the above arrangement, when the output frequency $f_{out}$ of the output frequency signal d output from the output terminal 5 of the PLL circuit is to be modulated, the decimal value J to be applied to the arithmetic circuit 15 need only be changed to (J+ΔJ).

As a consequence, as shown in FIGS. 17A and 17B, the output frequency $f_{out}$ of the output frequency signal d is described by:

$$f_{out}=[N \cdot J+\Delta J] \cdot f_{ref}$$

Since (J±ΔJ) assumes a decimal value below the decimal point, 0<J+ΔJ<1 holds.

In this case, since J is also a decimal value below the decimal point as a matter of course, 0<J<1 holds.

Accordingly, when J+ΔJ exceeds 1, the modulation width is limited in association with the integer value N or another measure must be taken to avoid it.

The frequency synthesizer adopting the multiple modulator fractional N scheme shown in FIG. 16 includes structural spurious components.

The structural spurious components will be explained below. For example, when a rational number such as ½ or ¾, the denominator of which is a small integer, is input to the arithmetic circuit 15, the phase errors E in the phase detector 2 have only patterns with short periods, as shown in FIG. 3A.

As a result, since error energy concentrates on specific frequency values and much error energy concentrates on periodically generated small spurious components, structural spurious components having high levels are consequently generated at a few specific frequencies.

In order to avoid generation of the structural spurious components having high levels generated at a few specific frequencies, a method of mixing a dither signal in a fractional frequency division ratio has been proposed by Jpn. Pat. Appln. KOKAI Publication No. 6-244721.

However, in order to mix the dither signal in the fractional frequency division ratio, many complicated circuits are required, and the circuit arrangement of the entire frequency synthesizer is further complicated.

On the other hand, Jpn. Pat. Appln. KOKAI Publication No. 2-198224 discloses a technique nearly equivalent to U.S. Pat. No. 4,546,331 above.

Accordingly, in the technique of Jpn. Pat. Appln. KOKAI Publication No. 2-198224 as well, the above-mentioned structural spurious components are assumed to be generated, but this problem is left undiscussed.

Also, Jpn. Pat. Appln. KOKAI Publication No. 2-198224 does not particularly refer to frequency modulation, but this technique is speculated to be free from the inconvenience in U.S. Pat. No. 4,546,331.

As described above, the conventional frequency synthesizers commonly have the following problems although they have both merits and demerits.

(1) High-level fractional spurious components cannot be easily reduced.

(2) High-level structural spurious components cannot be easily reduced.

(3) The frequency modulation range is limited.

DISCLOSURE OF INVENTION

The present invention has been made in consideration of the above situation, and has as its object to provide a rational frequency division device which can suppress fractional spurious components by a simple arrangement, can assure a broad frequency modulation range, and can easily reduce structural spurious components, since an arithmetic circuit for calculating the frequency division value to be set in a frequency divider has an arrangement that allows easy cascade connection of a plurality of cumulative adders, which are used in the arithmetic circuit and perform calculations in a rational number state including integer and decimal values, and a frequency synthesizer using the same.

According to one aspect of the present invention, there is provided a frequency synthesizer comprising a variable frequency oscillator for outputting a frequency signal having a frequency corresponding to an input signal, a frequency divider for frequency-dividing the frequency of the output frequency signal output from the variable frequency oscillator by an integer frequency division ratio applied, a phase detector for detecting a phase difference between a reference frequency signal and a frequency-divided signal output from the frequency divider, and outputting a phase difference signal corresponding to the phase difference to the variable frequency oscillator, and an arithmetic circuit for calculating a frequency division ratio, which becomes an input rational number defined by an integer value and a decimal value if an average value is calculated and is indicated by an integer value that changes instantaneously, upon receiving the rational value, and outputting the frequency division ratio to the frequency divider, wherein the arithmetic circuit has a plurality of cumulative adders which include a first cumulative adder that receives the rational number and are series-connected, an integer value extraction circuit for extracting an integer value from an output value of the cumulative adder of a final stage, and a delay circuit for outputting the integer value extracted by the integer value extraction circuit to the frequency divider as the frequency division ratio, and outputting the integer value to the cumulative adders as a feedback value, and each of the cumulative adders adds a value calculated by itself in a previous clock period to the input rational number or an output value of the cumulative adder of a previous stage, and subtracts the feedback value from the delay circuit therefrom.

According to another aspect of the present invention, there is provided a rational frequency division device comprising a frequency divider for frequency-dividing a frequency of an input frequency signal by an integer frequency division ratio applied, and an arithmetic circuit for calculating a frequency division ratio, which becomes an input rational number defined by an integer value and a decimal value if an average value is calculated and is indicated by an integer value that changes instantaneously, upon receiving the rational value, and outputting the frequency division ratio to the frequency divider, wherein the arithmetic circuit has a plurality of cumulative adders which include a first cumulative adder that receives the rational number and are series-connected, an integer value extraction circuit for extracting an integer value from an output value of the cumulative adder of a final stage, and a delay circuit for outputting the integer value extracted by the integer value extraction circuit to the frequency divider as the frequency division ratio, and outputting the integer value to the cumulative adders as a feedback value, and each of the cumulative adders adds a value calculated by itself in a previous clock period to the input rational number or an output value of the cumulative adder of a previous stage, and subtracts the feedback value from the delay circuit therefrom.

According to still another aspect of the present invention, there is provided a frequency synthesizer comprising a variable frequency oscillator for outputting a frequency signal having a frequency corresponding to an input signal, a frequency divider for frequency-dividing the frequency of the output frequency signal output from the variable frequency oscillator by an integer frequency division ratio applied, a phase detector for detecting a phase difference between a reference frequency signal and a frequency-divided signal output from the frequency divider, and outputting a phase difference signal corresponding to the phase difference to the variable frequency oscillator, and an arithmetic circuit for supplying an integer frequency division signal to the frequency divider upon receiving an input rational number (K) defined by an integer value (I) and a decimal value (J), characterized in that the arithmetic circuit includes a plurality of cumulative adders which are cascade-connected in at least three stages and have an integral function, and outputs the integer frequency division signal ($\alpha$k) on the basis of the rational number (K) defined by the integer value (I) and the decimal value (J).

According to still another aspect of the present invention, there is provided a rational frequency division device comprising a frequency divider for frequency-dividing a frequency of an input frequency signal by an integer frequency division ratio applied, and an arithmetic circuit for supplying an integer frequency division signal to the frequency divider upon receiving an input rational number (K) defined by an integer value (I) and a decimal value (J), characterized in that the arithmetic circuit includes a plurality of cumulative adders which are cascade-connected in at least three stages and have an integral function, and outputs the integer frequency division signal ($\alpha$k) on the basis of the rational number (K) defined by the integer value (I) and the decimal value (J).

According to still another aspect of the present invention, there is provided a frequency synthesizer comprising a variable oscillator, a frequency divider for frequency-dividing a frequency signal from the variable oscillator by an integer frequency division ratio in correspondence with a setting value, a phase detector for detecting a phase difference between a reference signal and a frequency-divided signal from the frequency divider, and outputting a phase difference signal corresponding to the phase difference to the variable oscillator, and an arithmetic circuit which has a plurality of (n) integrators which are cascade-connected in at least three stages, performs a calculation upon receiving a rational number (I,J) defined by an integer value (I) and a decimal value (J), and sets the calculation result in the frequency divider, so that the frequency-divided signal output from the frequency divider includes a rational number frequency component if an average value is calculated, and an error frequency component which decreases toward a low-frequency region at a gradient of about 6×n (dB/octave), and characterized in that the error frequency component is easily attenuated by a low-frequency characteristic of a loop constituted by the variable oscillator, the frequency divider, and the phase detector.

The reason why fractional spurious components can be reduced in the rational frequency division device and the frequency synthesizer using the same with the above arrangement will be explained below.

In general, the loop attenuation characteristics of a PLL circuit itself constituted by a closed loop of a phase detector, a variable frequency oscillator, and a frequency divider can sufficiently attenuate noise and spurious components having frequencies at positions sufficiently separated from the carrier frequency of an output frequency signal to be output from the variable frequency oscillator to an external circuit.

Paying attention to the PLL circuit characteristics, in the frequency synthesizer of the present invention, an arithmetic circuit for sequentially calculating frequency division ratios to be applied in turn to the frequency divider uses a plurality of cascade-connected cumulative adders to provide differential characteristics with respect to the switching characteristics of the frequency division ratio for the frequency divider, and an integer value extraction circuit extracts only an integer value by rounding off a decimal value from the output value of the cumulative adder. The extracted integer value is used as the frequency division ratio, and the frequency division ratio is delayed and fed back to each cumulative adder.

As a consequence, in the steady state wherein the PLL circuit has shifted to the lock state, the generation periods of instantaneous phase errors generated between the reference frequency signal input to the phase detector and the frequency-divided signal output from the frequency divider are not uniform but are dispersed to be lower than the Nyquist frequency. In addition, spurious components in the neighborhood of the carrier attenuate by the differential characteristics. In this way, spurious components appearing in the output frequency signal owing to the phase errors outside the frequency band are attenuated by the loop attenuation characteristics of the PLL circuit itself, thus obtaining an output signal with low spurious level over the entire frequency band.

Furthermore, in the frequency synthesizer of the present invention, since the arithmetic circuit has an arrangement that can cumulate the entire input rational number, when the output frequency signal is to be frequency-modulated, modulation can be made for the entire rational number to be applied to the arithmetic circuit, and the modulation width in this case can be set for the entire rational number obtained by adding integer and decimal values.

In this case, since the frequency division ratio to be finally input to the frequency divider need only satisfy the condition of an integer value, and the integer value of the frequency division ratio can be changed, the modulation width can be set to be an arbitrary value.

In the rational frequency division device of the present invention, the average frequency division ratio that frequency-divides the frequency of the input frequency signal can be consequently set to be not only an integer value but also a rational number defined by integer and decimal values.

As a consequence, in the rational frequency division device of the present invention, the frequency of the input frequency signal can be converted into an arbitrary frequency.

In this case, since an error frequency from the carrier frequency, which is instantaneously generated in the converted frequency signal, is uniformly distributed, large spurious components can be prevented from being generated at a specific frequency.

BRIEF DESCRIPTION OF THE DRAWINGS

FIGS. 4A, 4B, and 4C are graphs showing the instantaneous value characteristics of phase errors at the input stage of a phase detector in the rational frequency division device and the frequency synthesizer using the same shown in FIG. 1 as compared to those of the conventional device;

FIG. 5 is a graph showing the spurious level included in the output frequency signal of the conventional device;

FIG. 6 is a graph showing the spurious level included in the output frequency signal obtained when two stages of cumulative adders are used in the rational frequency division device and the frequency synthesizer using the same according to the first embodiment of the present invention;

FIG. 7 is a graph showing the spurious level included in the output frequency signal obtained when three stages of cumulative adders are used in the rational frequency division device and the frequency synthesizer using the same according to the first embodiment of the present invention;

FIGS. 8A and 8B are graphs showing the spurious level included in the output frequency signal obtained when five stages of cumulative adders are used in the rational frequency division device and the frequency synthesizer using the same according to the first embodiment of the present invention;

FIG. 9 is a detailed circuit diagram of an arithmetic circuit built in a rational frequency division device and a frequency synthesizer using the same according to the second embodiment of the present invention;

FIG. 10 is a block diagram of each cumulative adder that constitutes the arithmetic circuit shown in FIG. 9;

FIG. 16 is a schematic block diagram showing the arrangement of a conventional frequency synthesizer that adopts the multiple modulator fractional N scheme; and FIGS. 17A and 17B are graphs showing the modulation characteristics of the frequency synthesizer shown in FIG. 16.

BEST MODE OF CARRYING OUT THE INVENTION

The embodiments of the present invention will be described hereinafter.

(First Embodiment)

Figure 1:
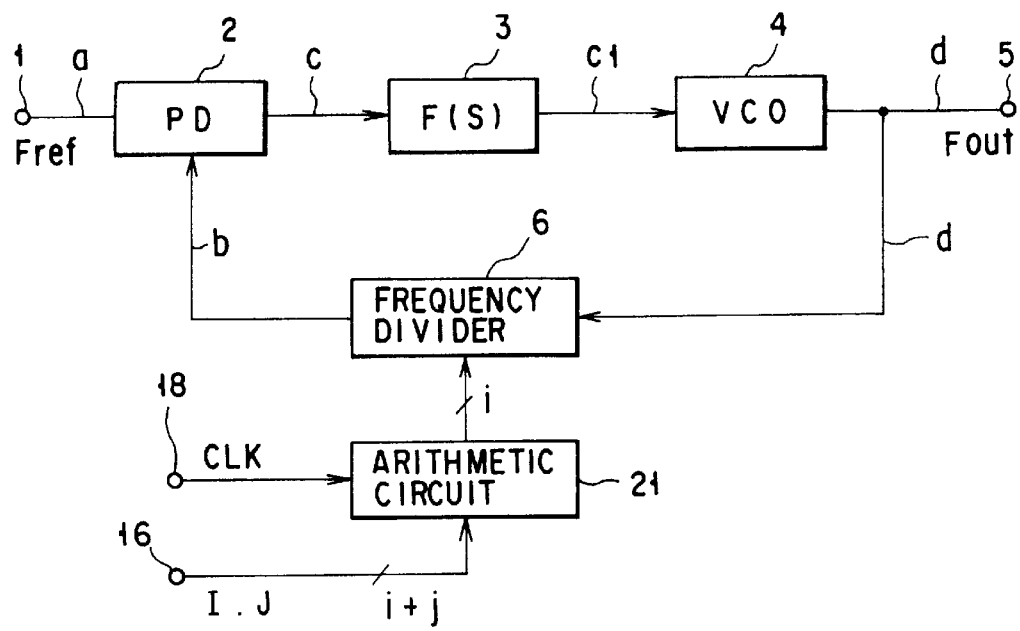
FIG. 1 is a schematic block diagram showing the arrangement of a rational frequency division device and a frequency synthesizer using the same according to the first embodiment of the present invention.

FIG. 1 is a schematic block diagram showing the arrangement of a rational frequency division device and a frequency synthesizer using the same according to the first embodiment of the present invention.

Figure 13:
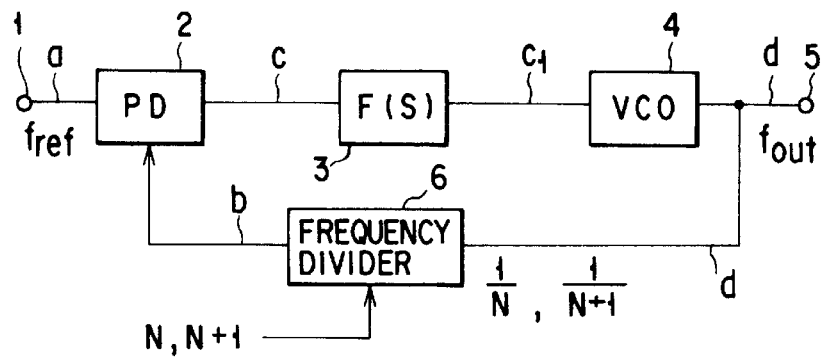
FIG. 13 is a schematic block diagram showing the arrangement of a conventional frequency synthesizer that adopts the fractional N scheme.
Figure 14:
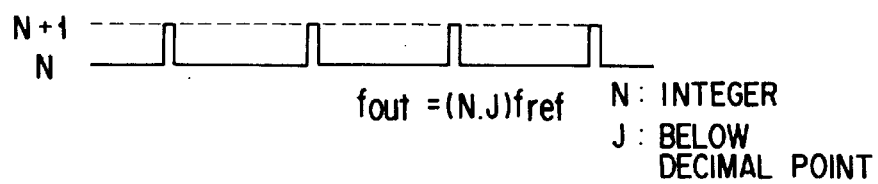
FIG. 14 is a waveform chart of the frequency division ratio set in a frequency divider of the conventional frequency synthesizer.
Figure 15:
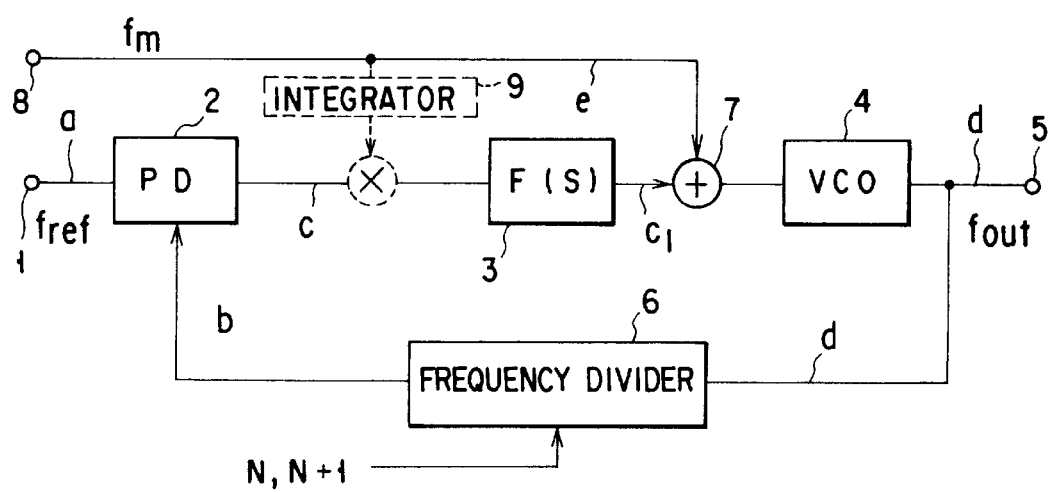
FIG. 15 is a schematic block diagram showing the arrangement used when the frequency modulation function is built in the conventional frequency synthesizer.

Note that the same reference numerals in FIG. 1 denote the same parts as in the conventional frequency synthesizers shown in FIGS. 13 and 16, and a detailed description of repetitive portions will be omitted.

More specifically, in FIG. 1, a reference frequency signal a having a reference frequency $f_{ref}$ input from an input terminal 1 is input to a phase detector 2.

The phase detector 2 detects the phase difference between the reference frequency signal a and a frequency-divided signal b output from a frequency divider 6, and outputs a phase difference signal c having a voltage proportional to the phase difference.

The phase difference signal c output from the phase detector 2 is input to a loop filter 3 to remove its high-frequency component, and thereafter, is input as a new phase difference signal $c_1$ to a VCO (voltage-controlled oscillator) 4 serving as a variable frequency oscillator.

The VCO 4 outputs an output frequency signal d having an output frequency $f_{out}$ proportional to the signal value of the phase difference signal $c_1$ to an output terminal 5.

Also, the output frequency signal d output from the VCO 4 is input to the frequency divider 6.

The frequency divider 6 frequency-divides the frequency of the output frequency signal d by an externally input frequency division ratio I (I: an integer) and applies the result as the frequency-divided signal b to the phase detector 2.

The frequency division ratio I set in the frequency divider 6 is supplied from an arithmetic circuit 21.

The arithmetic circuit 21 receives a rational number value [I·J] via an input terminal 16.

The rational number value [I·J] is defined by an i-bit integer value I and a j-bit decimal value J called a fractional value.

Furthermore, the arithmetic circuit 21 receives a clock signal CLK from an input terminal 18.

The arithmetic circuit 21 constitutes a rational frequency division device together with the frequency divider 6, and applies an i-bit arithmetic result as the frequency division ratio I to the frequency divider 6.

Figure 2:
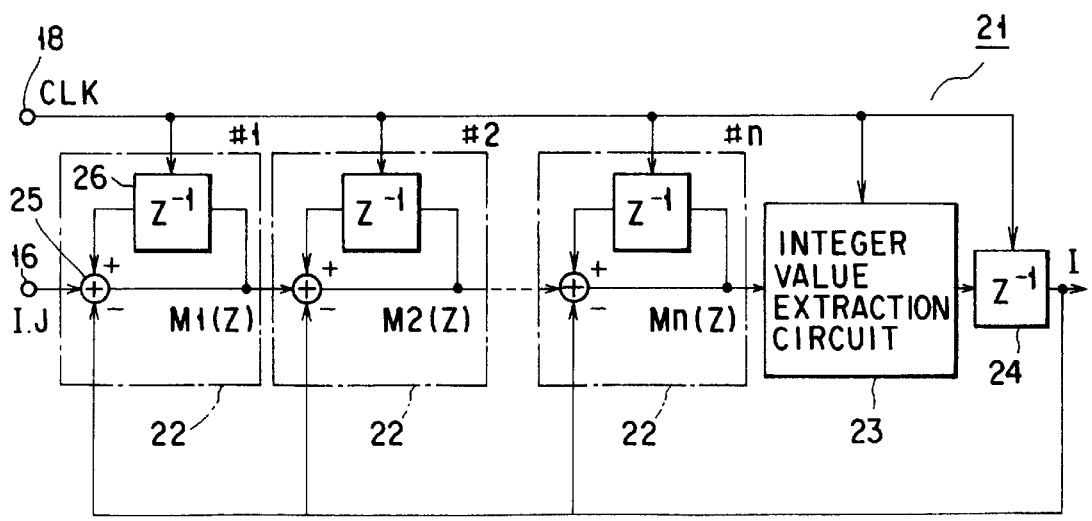
FIG. 2 is a detailed circuit diagram of an arithmetic circuit built in the rational frequency division device and the frequency synthesizer using the same shown in FIG. 1.

As shown in, e.g., FIG. 2, the arithmetic circuit 21 is constituted by n (n≧3) cascade-connected cumulative adders 22, an integer value extraction circuit 23 for extracting an integer value I from a sum value consisting of a rational number value output from the final-stage (n-th) cumulative adder 22, and a delay circuit 24 for delaying the integer value I extracted by the integer value extraction circuit 23 by one clock period $T_0$.

The i-bit integer value I output from the delay circuit 24 is output to the frequency divider 6, and is also fed back to the respective cumulative adders 22 as a feedback value.

The cumulative adders 22, the integer value extraction circuit 23, and the delay circuit 24 are applied with the clock signal CLK input from the input terminal 18.

In each cumulative adder 22, the rational number value output from the cumulative adder 22 of the previous stage and the feedback value are input to an adder 25.

The adder 25 also receives the sum obtained by delaying the sum by one clock period $T_0$ by a delay circuit 26.

More specifically, each cumulative adder 22 adds the output value in the previous clock period to the rational number value input from the cumulative adder 22 of the previous stage, also adds the sum in the previous clock period, and outputs the sum to the cumulative adder 22 of the next stage.

Note that the first (n=1) cumulative adder 22 receives an (i+j)-bit rational number [I·J] input via the input terminal 16.

The operation of the arithmetic circuit 21 shown in FIG. 2 will be described in detail below using equations.

If each value calculated by this arithmetic circuit 21 is expressed by a z function, the output values of the delay circuits 24 and 26 in the arithmetic circuit 21 assume values obtained by multiplying their input values with $[z^{-1}]$.

If $M_1(z), \ldots, M_n(z)$ represent the sums of the adders 25 in the first to n-th cumulative adders 22 in the arithmetic circuit 21, these sums $M_1(z), M_2(z), \ldots, M_n(z)$ are respectively given by the following equations:

$$M_1(z)=[I \cdot J]+z^{-1}M_1(z)-z^{-1}I(z) \quad (1)$$

$$M_2(z)=[I \cdot J]+z^{-1}M_2(z)-z^{-1}I(z) \quad (2)$$

$$M_{n-1}(z)=[I \cdot J]+z^{-1}M_{n-1}(z)-z^{-1}I(z) \quad (3)$$

$$M_n(z)=[I \cdot J]+z^{-1}M_n(z)-z^{-1}I(z) \quad (4)$$

$$I(z)=M_n(z)+\delta I(z) \quad (5)$$

Note that $\delta I(z)$ in equation (5) represents errors generated by extracting only an integer value I(z) and rounding off a decimal value J(z) (lower bits) by the integer value extraction circuit 23 from the sum value as a rational number output from the adder 25 of the final-stage (n-th stage) cumulative adder 22.

Accordingly, equation (5) amounts to adding an error $\delta I(z)$ between the average value and instantaneous value of the frequency-divided signal b output from the frequency divider 6 to the integer value I(z) applied to the frequency divider 6 in the PLL circuit.

Equation (5) can be rewritten as the following equation (6):

$$M_n(z)=I(z)-\delta I(z) \quad (6)$$

Substituting equation (6) into equation (4) yields the following equation (7):

$$M_{n-1}(z)=I(z)-(1-z^{-1})\delta I(z) \quad (7)$$

Also, substituting equation (7) into equation (3) yields the following equation (8):

$$M_{n-2}(z)=I(z)-(1-z^{-1})^2\delta I(z) \quad (8)$$

Likewise, equation (9) below is obtained:

$$M_1(z)=I(z)-(1-z^{-1})^{n-1}\delta I(z) \quad (9)$$

Substituting equation (9) into equation (1) yields the following equation (10):

$$I(z)=[I \cdot J]+(1-z^{-1})^n\delta I(z) \quad (10)$$

Since the integer value I(z) in equation (10) is set in the frequency divider 6 as the frequency division ratio, the z-converted output frequency $f_{out}(z)$ of the output frequency signal d can be expressed by equation (11) below using the reference frequency $f_{ref}$ of the reference frequency signal a in the locked state of the PLL circuit:

$$f_{out}(z)=[I \cdot J]f_{ref}+(1-z^{-1})^n\delta I(z)f_{ref} \quad (11)$$

As can be understood from equation (11), the output frequency $f_{out}$ of the output frequency signal d is defined by the frequency components $\{[I \cdot J]f_{ref}\}$ corresponding to rational number multiples of the reference frequency $f_{ref}$ and spurious components $\{(1-z^{-1})^n\delta I(z)f_{ref}\}$ produced due to phase errors (phase jitter).

Furthermore, such spurious components have differential characteristics $(1-z^{-1})^n$ having the same order n as the number of setting stages of the cumulative adders 22.

Therefore, by increasing the order n (the number of setting stages), the noise shaping effect can be enhanced and the spurious level in the neighborhood of the carrier frequency $(=[I \cdot J]f_{ref})$ containing a structural spurious component can be lowered.

In addition, when the arrangement of the present invention is adopted, the order n can be stably increased by increasing the number n of setting stages of the cumulative adders 22 without being saturated.

In order to qualitatively explain decreases in spurious level in the neighborhood of the carrier, assuming that error components $\delta I(z)$ are input to the arithmetic circuit 21 to output I(z), it is contemplated that a feedback route along which the output from the integer value extraction circuit 23 is fed back to the input via the delay circuit 24 and the respective cumulative adders 22 is formed in the arithmetic circuit 21 when viewed from the integer value extraction circuit 23, and a large number of stages of integrators constituted by the cumulative adders 22 in the feedback route are connected.

Therefore, since the integrators are present in the feedback route, they consequently show differential characteristics with respect to the error components $\delta I(z)$.

That is, it is surmised that since this arrangement is equivalent to that of a high-pass filter, the above-mentioned noise shaping effect is obtained.

In this case, the noise shaping effect based on the number n of setting stages of the cumulative adders 22 is 6×n (dB/octave), and tends to lower in the low-frequency region.

This noise shaping effect can be demonstrated by executing simulation arithmetic operations using a sequence in the time domain.

The procedure of the simulation arithmetic operations will be briefly described below.

More specifically, assuming that the rational number [I·J] is input to the arithmetic circuit 21, the arithmetic circuit 21 is constituted by three stages of cumulative adders 22, $S_1(k)$, $S_2(k)$, and $S_3(k)$ represent the output values of the first, second, and third cumulative adders 22 from the input side, and I(k) represents the output value of the integer value extraction circuit 23, we can obtain the following equations:

$$S_1(k+1) = [I \cdot J] + S_1(k) - I(k) \quad (12)$$

$$S_2(k+1) = S_1(k+1) + S_2(k) - I(k) \quad (13)$$

$$S_2(k+1) = S_2(k+1) + S_3(k) - I(k) \quad (14)$$

$$I(k) = INT_{max}\{S_3(k)\} \quad (15)$$

Note that $INT_{max}\{S_3(k)\}$ in equation (15) represents a maximum integer value equal to or smaller than $S_3(k)$.

In each of equations (12), (13), and (14), S(k+1) represents the state of the output value S(k) after an elapse of one clock period $T_0$.

Modifying equation (14) yields the following equation (16):

$$S_2(k+1) = S_3(k+1) - S_3(k) - I(k) \quad (16)$$

Substituting equation (16) into equation (13) yields the following equation (17):

$$S_2(k+2) = S_3(k+2) - 2S_3(k+1) + S_3(k) + 2I(k+1) - I(k) \quad (17)$$

Furthermore, substituting equation (17) into equation (12) yields the following equation (18):

$$S_3(k+3) = [I \cdot J] + 3S_3(k+2) - 3S_3(k+1) + S_3(k) - 3I(k+2) + 3I(k+1) - I(k) \quad (18)$$

Since equation (18) is uniquely determined by giving the initial value of $S_3(k)$, an instantaneous value (error) $\delta I(k)$ of a frequency division ratio I(k) to be set in the frequency divider 6 is obtained from equation (15).

From this instantaneous value (error) $\delta I(k)$, a phase difference $\delta\phi(k)$ between the reference frequency $f_{ref}$ and an instantaneous frequency $f_{div}$ of the frequency-divided signal c output from the frequency divider 6 is calculated in the following procedure:
ti $f_{div}(k) = f_{out}/I(k)$, $$\delta\phi(k) = 2\pi f_{ref}[(1/f_{ref}) - (1/f_{div}(k))] \cdot [I \cdot J] \quad (19)$$

From a phase difference $\delta\phi(f)$ (f; frequency) obtained by Fourier-transforming the phase difference $\delta\phi(k)$ into the frequency domain, and the infinitesimal angle modulation theorem, single sideband phase noise £(f) can be expressed by the following equation (20):

$$£(f) = \{\delta\phi(f)/2\}^2 \quad (20)$$

FIGS. 3B and 3C, FIGS. 4B and 4C, and FIGS. 6 and 7 are graphs showing the operations of the frequency synthesizer of the first embodiment shown in FIGS. 1 and 2 calculated by the above-mentioned simulation arithmetic operations.

Figure 3A:
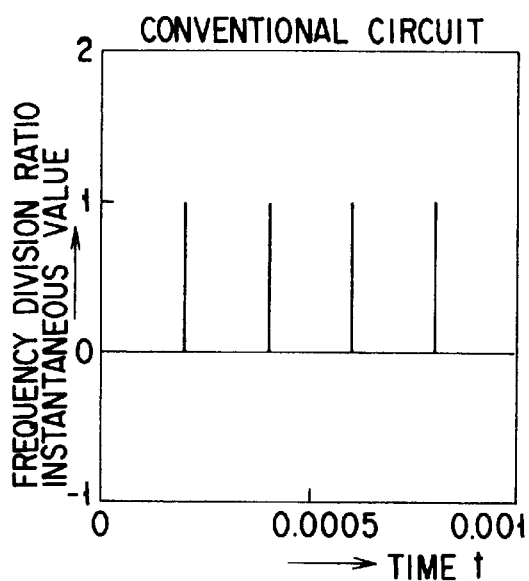
FIGS. 3A, 3B, and 3C are graphs showing the instantaneous value characteristics of the output from a frequency divider in the rational frequency division device and the frequency synthesizer using the same shown in FIG. 1 as compared to those of a conventional device.

The detailed conditions in this case are the same as the simulation conditions of the conventional frequency synthesizer shown in FIGS. 3A, 4A, and 5.

More specifically, assume that the clock frequency of the clock signal CLK is set to be 500 kHz, and the decimal value J of the rational number [I·J] is set to be 0.001.

Furthermore, simulation arithmetic operations were conducted in correspondence with cases including two and three stages of cumulative adders 22.

Figure 3B:
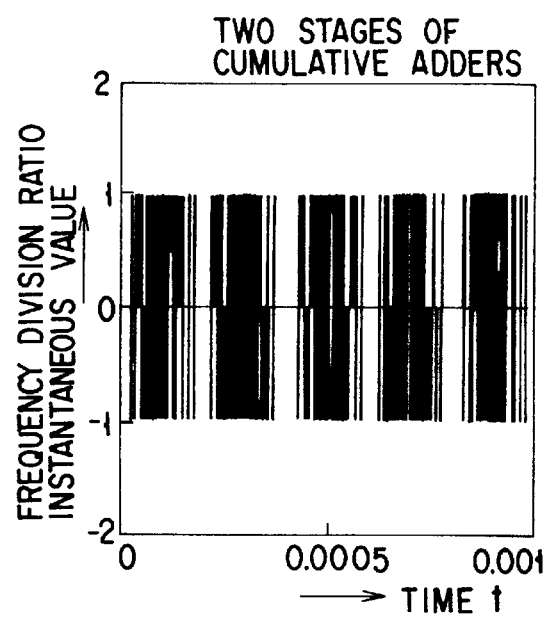
Figure 3C:
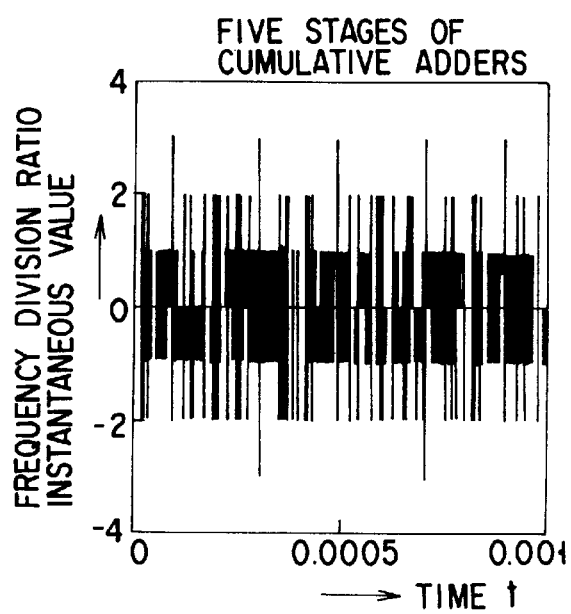

FIGS. 3A, 3B, and 3C show the instantaneous values of the decimal part of the frequency division ratio set in the frequency divider 6 in the case of the conventional synthesizer (FIG. 3A), the case of the two stages in this embodiment (FIG. 3B), and the case of the three stages in this embodiment (FIG. 3C).

The characteristics of the conventional apparatus (FIG. 3A) have given periodicity, but the characteristics (FIGS. 3B and 3C) of this embodiment have weaker periodicities as the number of stages of the cumulative adders 22 is larger.

FIGS. 4A, 4B, and 4C show the phase errors E between the reference frequency a and the frequency-divided signal c at the input stage of the phase detector 2 in the case of the conventional synthesizer (FIG. 4A), the case of the two stages in this embodiment (FIG. 4B), and the case of the three stages in this embodiment (FIG. 4C).

The characteristics of the conventional apparatus (FIG. 4A) are defined by a periodic, typical sawtooth waveform, but the waveform deforms and the periodicity weakens in the characteristics of this embodiment (FIGS. 4B and 4C) as the number of stages of the cumulative adders 22 is larger.

FIGS. 5, 6, and 7 show the spurious levels with respect to the offset frequency $f_{OFF}$ from the carrier frequency, which is plotted along the abscissa, in the case of the conventional synthesizer (FIG. 5), the case of the two stages in this embodiment (FIG. 6), and the case of the three stages in this embodiment (FIG. 7).

In the characteristics of the conventional apparatus (FIG. 5), large peak values having high levels are produced in the vicinity of the carrier, as can also be understood from the periodic characteristics of the phase errors E shown in FIG. 4A.

In the case of the two stages of this embodiment (FIG. 6), spurious components in the vicinity of the carrier are attenuated due to the differential characteristics, and in the case of the three stages of this embodiment (FIG. 7), spurious components are further attenuated.

Since spurious components present at frequencies sufficiently separated from the carrier can be attenuated by the attenuation characteristics of the PLL circuit, a low-spurious output frequency signal d can be obtained in the whole frequency band.

According to these simulation results, it is demonstrated that the conventional apparatus can only reduce the spurious level to about −70 dB, but this embodiment using the three stages of cumulative adders 22 can reduce the spurious level to −100 dB or less.

FIGS. 8A and 8B show the simulation calculation results of the spurious characteristics included in the output frequency signal d when five stages of cumulative adders 22 are used in the frequency synthesizer of the first embodiment shown in FIGS. 1 and 2.

The characteristics indicated by the solid curve in FIG. 8A represent the spurious characteristics when the high-frequency attenuation function of the PLL circuit itself is not taken into consideration.

The characteristics indicated by the solid curve in FIG. 8B represent the spurious characteristics closer to those of an actual PLL circuit when the high-frequency attenuation function of the PLL circuit itself is taken into consideration.

As can be understood from the above description, when the loop response characteristics of the PLL circuit are set to be an optimal value, the level of the spurious characteristics can be effectively reduced.

Note that the characteristics indicated by thin curves above the spurious characteristics indicated by solid curves in FIGS. 8A and 8B represent the maximum value characteristics of the above-mentioned structural spurious components.

Note that a dotted curve in FIG. 8B represents the attenuation characteristics of the PLL circuit including the loop filter 3 as well.

As shown in FIG. 8B, when about five stages of cumulative adders 22 are built in the arithmetic circuit 21, the spurious characteristics can be readily reduced to −100 dB or less over the entire frequency range.

In the frequency synthesizer shown in FIG. 1, frequency modulation of the output frequency signal d is attained by modulating the entire rational number [I·J] to be applied to the arithmetic circuit 21.

More specifically, if Δ[I·J] represents the frequency shift width, the output frequency $f_{out}$ of the output frequency signal d is given by the following equation using the reference frequency $f_{ref}$ and the rational number [I·J +ΔI·J]:

$$f_{out}=[I \cdot J+\Delta I \cdot J] \cdot f_{ref}$$

In this case, the entire rational number [I·J+ΔI·J] is input to the arithmetic circuit 21, and the respective cumulative adders 22 execute arithmetic operations for the entire [I·J+ ΔI·J]. Finally, the integer value extraction circuit 23 extracts an integer value from the sum of the rational number, and outputs it to the frequency divider 6.

Hence, the value to be finally input to the frequency divider 6 need only satisfy the integer value condition, and need not satisfy the condition of (J+ΔJ)<[1] unlike in the conventional multiple-modulator fractional N type frequency synthesizer shown in FIG. 16.

As a consequence, independently of, e.g., the decimal value J, the frequency shift width $\Delta I \cdot J_{max}$ is not limited by the value J.

That is, a modulation width ΔI·J can be set to an arbitrary value.

On the other hand, since the rational number [I·J] to be input to the arithmetic circuit 21 is modulated, the frequency range of the modulation frequency is not particularly limited, and frequency modulation is allowed within a low-frequency region from the direct current (DC) region to the cut-off frequency $f_c$ of the loop frequency of the PLL circuit.

(Second Embodiment)

FIG. 9 is a schematic block diagram showing the arrangement of an arithmetic circuit 21a built in a frequency synthesizer according to the second embodiment of the present invention.

Since the overall arrangement of this frequency synthesizer is the same as that of the frequency synthesizer of the first embodiment shown in FIG. 1, a detailed description of repetitive portions will be omitted.

The arithmetic circuit 21a in this frequency synthesizer is constituted by n stages of cascade-connected cumulative adders 31 and a register 32.

A rational number [I,J] input from an input terminal 16 is input to the first cumulative adder 31 in the arithmetic circuit 21a.

The rational number [I,J] input to the arithmetic circuit 21a is defined by an i-bit integer value I and a j-bit decimal value J.

The respective cumulative adders 31 and the register 32 in the arithmetic circuit 21a are applied with a clock signal CLK input via an input terminal 18.

Upon receiving one clock signal CLK, the register 32 fetches and holds an upper i-bit integer value I from an (i+j)-bit rational number [I,J] output from the final-stage (n-th) cumulative adder 31.

Upon receiving the next clock signal CLK, the register 32 outputs the held i-bit integer value I to a frequency divider 6 as a frequency division ratio, and also outputs this integer value I to the respective cumulative adders 31 as a feedback value.

More specifically, the register 32 constitutes an integer value extraction circuit for extracting an integer value from the sum value of the final-stage (n-th) cumulative adder 31 and a delay circuit for delaying the extracted integer value by one clock period $T_0$.

Each cumulative adder 31 in the arithmetic circuit 21a is constituted by an adder 33, a subtracter 34, and a register 35, as shown in FIG. 10.

Referring to FIG. 10, an (i+j)-bit rational number [I,J] output from the cumulative adder 31 of the previous stage is input to one input terminal 33a of the adder 33.

Also, the other input terminal 33b of the adder 33 receives an (i+j)-bit rational number [I,J] output from the register 35 serving as an intra-circuit delay circuit.

The adder 33 adds the rational numbers input from the input terminals 33a and 33b in synchronism with the clock signal CLK, and outputs an (i+j)-bit sum value.

An upper i-bit integer value of the sum value output from the adder 33 is applied to one input terminal 34a of the subtracter 34.

The other input terminal 34b of the subtracter 34 receives the i-bit integer value I output from the register 32 shown in FIG. 9 as a feedback value.

The subtracter 34 subtracts the integer value input to the input terminal 34b from the integer value input to the input terminal 34a in synchronism with the clock signal CLK, and outputs an i-bit difference value.

A lower j-bit decimal value J of the sum value output from the adder 33 and the i-bit integer value output from the subtracter 34 are synthesized, and the synthesized value is output as the sum value of the (i+j)-bit rational number [I,J] to the cumulative adder 31 of the next stage.

The (i+j)-bit rational number [I,J] is also input to the register 35.

The register 35 delays the input (i+j)-bit rational number [I,J] by one clock period $T_0$, and outputs the delayed value to the input terminal 33b of the adder 33.

In this way, the cumulative adder 31 constituted by a plurality of digital operational elements adds its own sum result in the previous clock period to the sum result of the previous cumulative adder 31, and subtracts the integer value to be output to the frequency divider 6 therefrom, as in each cumulative adder 31 in the first embodiment shown in FIG. 2.

Accordingly, the arithmetic circuit 21a shown in FIG. 9 performs the same arithmetic processing operation as that of the arithmetic circuit 21 of the first embodiment shown in FIG. 2.

Hence, the frequency synthesizer of the second embodiment can provide substantially the same technical effects as those of the frequency synthesizer of the first embodiment shown in FIGS. 1 and 2.

(Third Embodiment)

Figure 11:
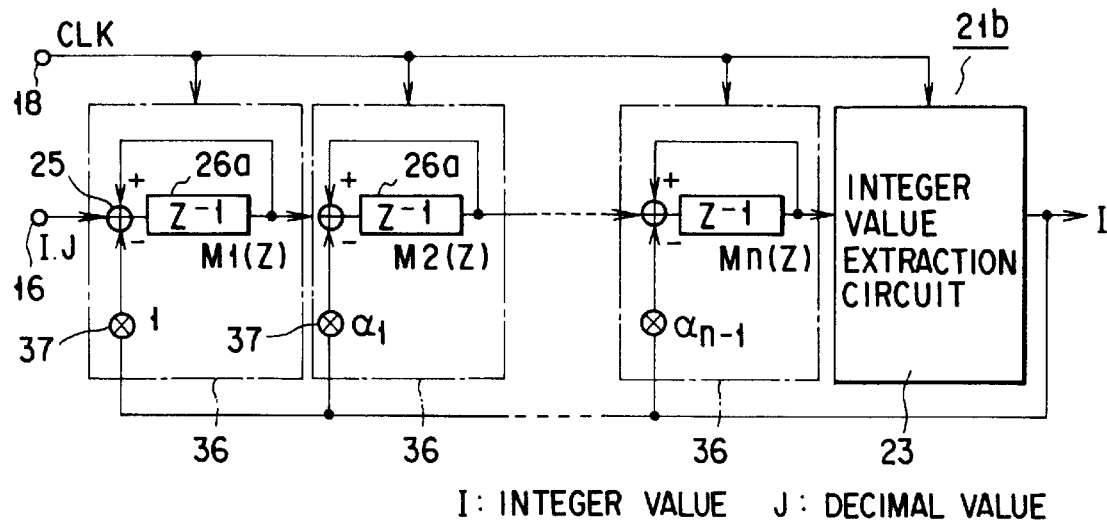
FIG. 11 is a detailed circuit diagram of an arithmetic circuit built in a rational frequency division device and a frequency synthesizer using the same according to the third embodiment of the present invention.

FIG. 11 is a schematic block diagram showing the arrangement of an arithmetic circuit 21b built in a frequency synthesizer according to the third embodiment of the present invention.

Since the overall arrangement of this frequency synthesizer is the same as that of the frequency synthesizer of the first embodiment shown in FIG. 1, a detailed description of repetitive portions will be omitted.

The arithmetic circuit 21b in this frequency synthesizer n (n≧2) stages of cascade-connected cumulative adders 36, and an integer value extraction circuit 23 for extracting an integer value from the sum value defined by the rational number value output from the final-stage (n-th) cumulative adder 36.

An i-bit integer value I output from the integer value extraction circuit 23 in the arithmetic circuit 21b is output to a frequency divider 6 as the arithmetic operation result, and is also fed back to the respective cumulative adders 36 in the arithmetic circuit 21b.

The respective cumulative adders 36 and the integer value extraction circuit 23 in the arithmetic circuit 21b are applied with a clock signal CLK input from an input terminal 18.

Each cumulative adder 36 in the arithmetic circuit 21b is constituted by an adder 25, a delay circuit 26a, and a multiplier 37.

Note that multipliers α of the respective multipliers 37 are set to have different values ($\alpha=1, \alpha_1, \ldots, \alpha_{n-1}$) in correspondence with their setting positions, from the head position, of the cumulative adders 36 in which the corresponding multipliers 37 are built in.

More specifically, the multiplier α of each multiplier 37 is given by the following polynomial (21):

$$(1+X)^n = 1 + \alpha_1 x + \alpha_2 x^2 + \ldots + \alpha_{n-1} x^{n-1} + x^n \quad (21)$$

For example, when three stages of cumulative adders 36 are built in, the multiplier α of the first cumulative adder 36 is 1, and the multiplier $\alpha_1$ of the second cumulative adder 36 is 3.

Furthermore, the multiplier $\alpha_2$ of the third (final stage) cumulative adder 36 is 3.

On the other hand, when four stages of cumulative adders 36 are built in, the multiplier α of the first cumulative adder 36 is 1, and the multiplier $\alpha_1$ of the second cumulative adder 36 is 4.

Furthermore, the multiplier $\alpha_2$ of the third cumulative adder 36 is 6, and the multiplier $\alpha_3$ of the fourth (final stage) cumulative adder 36 is 4.

The adder 25 in each cumulative adder 36 receives the sum value of the cumulative adder 36 of the previous stage, its own sum result in the previous clock period $T_0$ delayed by the delay circuit 26a, and an integer value obtained by multiplying the integer value to be output to the frequency divider 6 with the multiplier α.

More specifically, each cumulative adder 36 in the arithmetic circuit 21b performs substraction between a value obtained by adding the output value in the nth previous clock period to the rational number input from the cumulative adder 36 of the previous stage, and multiplying the sum with α, and the sum value in the previous clock period, and outputs the calculated value to the cumulative adder 36 of the next stage.

Note that the first (n=1) cumulative adder 36 receives an (i+j)-bit rational number [I·J] input via an input terminal 16.

Accordingly, the z-converted output frequency $f_{out}$ of the output frequency signal d given by equation (11) in the first embodiment is described by the following equation:

$$f_{out}(z) = (z^{-1})^n [I\cdot J] f_{ref} + (1-z^{-1})^n \delta I(z) f_{ref} \quad (22)$$

As can be understood from a comparison between equations (22) and (11), the frequency synthesizer of the third embodiment can obtain substantially the same frequency characteristics as those of the frequency synthesizer of the first embodiment having the arithmetic circuit 21 shown in FIG. 2, except that the frequency multiplied with the rational number [I·J] is output while being delayed by a time n times the clock period $T_0$.

Furthermore, in the cumulative adder 22 of the first embodiment, the total arithmetic time of the n stages of cumulative adders 22 required from when the rational number is input to the first cumulative adder 22 until the sum value is output from the cumulative adder 22 of the final stage must fall within one clock period $T_0$.

In contrast to this, in the cumulative adders 36 of the third embodiment, the arithmetic time required from when the sum value from the cumulative adder 36 of the previous stage is input until the sum value is output to the cumulative adder 36 of the next stage after predetermined addition/subtraction need only fall within one clock period $T_0$.

Therefore, if the arithmetic processing speeds of the cumulative adders 22 and 36 remain nearly the same, the frequency synthesizer of the third embodiment can increase the processing speed of the entire apparatus by shortening the clock period $T_0$ of the clock signal CLK.

(Fourth Embodiment)

Figure 12:
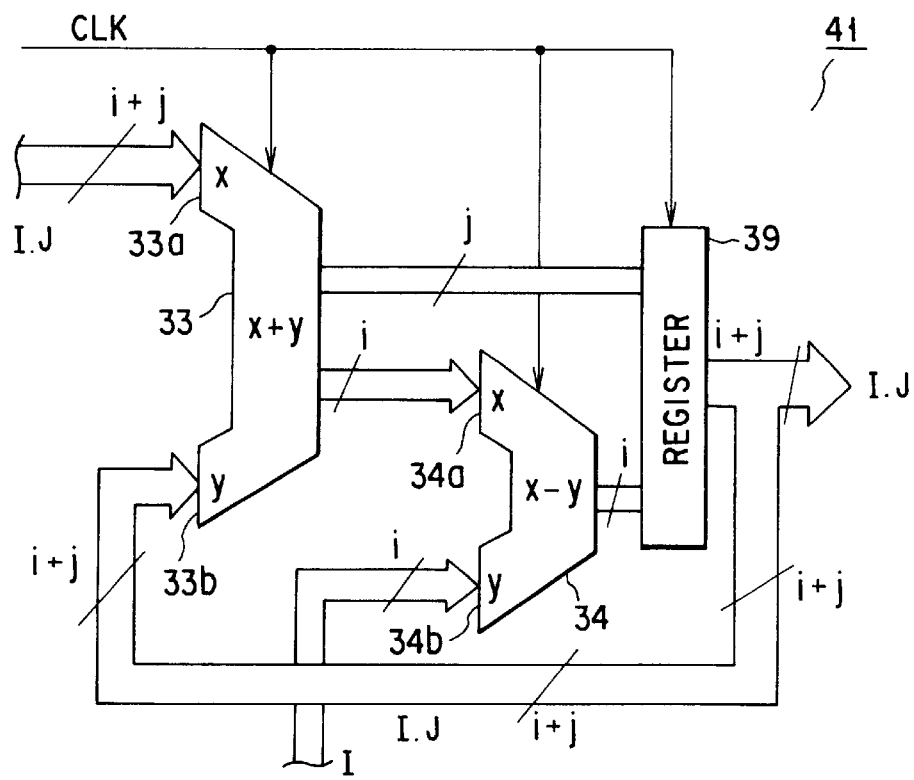
FIG. 12 is a block diagram of each cumulative adder built in a rational frequency division device and a frequency synthesizer using the same according to the fourth embodiment of the present invention.

FIG. 12 is a schematic block diagram showing the arrangement of each of n stages of cumulative adders that constitute an arithmetic circuit built in a frequency synthesizer according to the fourth embodiment of the present invention.

In the arithmetic circuit in which cumulative adders 41 of the fourth embodiment are built in, a register 32 is built in after the cumulative adder 41 of the final stage as in the arithmetic circuit 21b of the second embodiment shown in FIG. 9.

The same reference numerals in FIG. 12 denote the same parts as in the cumulative adder 31 shown in FIG. 10, and a detailed description of repetitive portions will be omitted.

In each cumulative adder 41 of the fourth embodiment, the register 35 inserted in the feedback path of the cumulative adder 31 shown in FIG. 10 is removed, and a common register 39 is inserted at the output stage of an adder 33 and the output stage of a subtracter 34.

The register 39 in each cumulative adder 41 has a function of delaying the output values from the adder 33 and the subtracter 34 by one clock period $T_0$.

More specifically, each cumulative adder 41 in the fourth embodiment has the same operation and characteristics as those of the cumulative adder 36 in the arithmetic circuit 21b in the third embodiment shown in FIG. 11.

In this way, according to the frequency synthesizer of the fourth embodiment, substantially the same effect as that of the frequency synthesizer of the third embodiment shown in FIG. 11 can be obtained.

In the above embodiments, an arithmetic circuit is essentially an arithmetic circuit (21, 21a, 21b) that gives an integer frequency-divided signal (αk) to the frequency divider (6) upon receiving an input rational number (K) defined by an integer value (I) and a decimal value (J), includes a plurality of cumulative adders (22, 31, 36, 41) which are cascade-connected in at least three stages and have an integral function, and need only have a function of outputting the integer frequency-divided signal (αk) on the basis of the rational number (K) defined by the integer value (I) and the decimal value (J).

In this case, the frequency-divided signal (αk) substantially satisfies the relation given by the following equation with respect to the rational number (K) defined by the integer value (I) and the decimal value (J):

$$K = \lim_{k \to \infty} \frac{1}{n} \sum_{k=1}^{n} \alpha k$$

More specifically, this essentially means that the arithmetic circuit (21, 21a, 21b) calculates the frequency division ratio, which becomes the rational number if the average value is calculated, and is indicated by an integer value that changes instantaneously, upon receiving the input rational number defined by the integer value and the decimal value, and outputs it to the frequency divider.

The present invention is not limited to the first to fourth embodiments described above.

For example, in each of the above embodiments, the frequency synthesizer comprising the PLL circuit is constituted by a rational frequency division device consisting of the frequency divider 6 and the arithmetic circuit 21 (21*a*, 21*b*), the phase detector 2, the loop filter 3, and the VCO 4.

Hence, the rational frequency division device can be used alone, or can be built in various other apparatuses other than the frequency synthesizer comprising the PLL circuit.

For example, the minimum resolution of the output frequency of a DDS (Direct digital synthesizer) using a 16-bit binary NCO (Numerically Controlled Oscillator) is Fclk/$2^{16}$ where Fclk is the clock frequency of the NCO.

Accordingly, in order to obtain a decimal output frequency in this DDS, a clock frequency of $2_{16} \times 10_n$ clocks is required.

For example, if the clock signal has a frequency of 65.536 MHz, a decimal output frequency having a minimum resolution of 1 kHz can be obtained. However, when this clock signal is used as the reference signal of another decimal control circuit, it must be converted into a frequency of 10 MHz or the like.

In such case, in the conventional frequency divider using an integer frequency division ratio N, 65.536 MHz must be frequency-divided by 65,536 and then be multiplied with 10,000. Thereafter, the frequency-divided signal must be supplied to a band-pass filter having a narrow frequency band.

Hence, in the rational frequency division device of the present invention, 65.536 MHz can be directly frequency-divided by 6.5536 and the frequency-divided signal is supplied to a band-pass filter to obtain a low-spurious 10-MHz output.

As described above, in the rational frequency division device of the present invention and the frequency synthesizer using the same, the arithmetic circuit for calculating the frequency division value to be set in the frequency divider is constituted by cascade-connecting a plurality of cumulative adders that perform calculations in the rational number state including an integer value and a decimal value.

In sum, in the rational frequency division device of the present invention and the frequency synthesizer using the same, fractional spurious components can be suppressed by a simple arrangement, and the frequency modulation range in the case of frequency-modulating an output frequency signal can be broadened. In addition, structural spurious components can be easily eliminated.

We claim:

1. A frequency synthesizer comprising:
    a variable frequency oscillator for outputting a frequency signal having a frequency corresponding to an input signal;
    a frequency divider for frequency-dividing the frequency of the output frequency signal output from said variable frequency oscillator by an integer frequency division ratio applied;
    a phase detector for detecting a phase difference between a reference frequency signal and a frequency-divided signal output from said frequency divider, and outputting a phase difference signal corresponding to the phase difference to said variable frequency oscillator; and
    an arithmetic circuit for calculating a frequency division ratio, which becomes an input rational number defined by an integer value and a decimal value if an average value is calculated and is indicated by an integer value that changes instantaneously, upon receiving the rational value, and outputting the frequency division ratio to said frequency divider,
    wherein said arithmetic circuit has a plurality of cumulative adders which include a first cumulative adder that receives the rational number and are cascade-connected, an integer value extraction circuit for extracting an integer value from an output value of the cumulative adder of a final stage, and a delay circuit for outputting the integer value extracted by said integer value extraction circuit to said frequency divider as the frequency division ratio, and outputting the integer value to said cumulative adders as a feedback value, and
    each of said cumulative adders adds a value calculated by itself in a previous clock period to the input rational number or an output value of the cumulative adder of a previous stage, and subtracts the feedback value from said delay circuit therefrom.

2. A frequency synthesizer according to claim 1, wherein each of said cumulative adders has an adder for adding the input rational number or the output value from the cumulative adder of the previous stage and the feedback value and outputting the sum value, a subtracter for performing a substraction between an integer value of the output value from said adder and an integer feedback value output from said delay circuit and outputting the difference value, an intra-circuit delay circuit for synthesizing and delaying an integer output value from said subtracter and a decimal value of the output from said adder, and outputting the delayed value to said adder as a feedback value, and output means for synthesizing the integer output value from said subtracter and the decimal value of the output value from said adder and outputting the synthesized value as the output value to the cumulative adder of a next stage or said integer value extraction circuit.

3. A frequency synthesizer according to claim 1, wherein said arithmetic circuit comprises at least three stages of cascade-connected cumulative adders.

4. A rational frequency division device comprising:
    a frequency divider for frequency-dividing a frequency of an input frequency signal by an integer frequency division ratio applied; and
    an arithmetic circuit for calculating a frequency division ratio, which becomes an input rational number defined by an integer value and a decimal value if an average value is calculated and is indicated by an integer value that changes instantaneously, upon receiving the rational value, and outputting the frequency division ratio to said frequency divider,
    wherein said arithmetic circuit has a plurality of cumulative adders which include a first cumulative adder that receives the rational number and are cascade-connected, an integer value extraction circuit for extracting an integer value from an output value of the cumulative adder of a final stage, and a delay circuit for outputting the integer value extracted by said integer value extraction circuit to said frequency divider as the frequency division ratio, and outputting the integer value to said cumulative adders as a feedback value, and
    each of said cumulative adders adds a value calculated by itself in a previous clock period to the input rational number or an output value of the cumulative adder of a previous stage, and subtracts the feedback value from said delay circuit therefrom.

5. A rational frequency division device according to claim 4, wherein each of said cumulative adders has an adder for adding the input rational number or the output value from the cumulative adder of the previous stage and the feedback value and outputting the sum value, a subtracter for performing a substraction between an integer value of the output value from said adder and an integer feedback value output from said delay circuit and outputting the difference value, an intra-circuit delay circuit for synthesizing and delaying an integer output value from said subtracter and a decimal value of the output from said adder, and outputting the delayed value to said adder as a feedback value, and output means for synthesizing the integer output value from said subtracter and the decimal value of the output value from said adder and outputting the synthesized value as the output value to the cumulative adder of a next stage or said integer value extraction circuit.

6. A rational frequency division device according to claim 4, wherein said arithmetic circuit comprises at least three stages of cascade-connected cumulative adders.

7. A frequency synthesizer comprising:
a variable frequency oscillator for outputting a frequency signal having a frequency corresponding to an input signal;
a frequency divider for frequency-dividing the frequency of the output frequency signal output from said variable frequency oscillator by an integer frequency division ratio applied;
a phase detector for detecting a phase difference between a reference frequency signal and a frequency-divided signal output from said frequency divider, and outputting a phase difference signal corresponding to the phase difference to said variable frequency oscillator; and
an arithmetic circuit for supplying an integer frequency division signal to said frequency divider upon receiving an input rational number defined by an integer value and a decimal value,
wherein said arithmetic circuit includes a plurality of cumulative adders which are cascade-connected in at least three stages and have an integral function, and
outputs the integer frequency division signal on the basis of the rational number defined by the integer value and the decimal value.

8. A frequency synthesizer according to claim 7, wherein each of said cumulative adders has an adder for adding the input rational number or the output value from the cumulative adder of the previous stage and the feedback value and outputting the sum value, a subtracter for performing a substraction between an integer value of the output value from said adder and an integer feedback value output from said delay circuit and outputting the difference value, an intra-circuit delay circuit for synthesizing and delaying an integer output value from said subtracter and a decimal value of the output from said adder, and outputting the delayed value to said adder as a feedback value, and output means for synthesizing the integer output value from said subtracter and the decimal value of the output value from said adder and outputting the synthesized value as the output value to the cumulative adder of a next stage or said integer value extraction circuit.

9. A frequency synthesizer according to claim 7, wherein said arithmetic circuit comprises at least three stages of cascade-connected cumulative adders.

10. A rational frequency division device comprising:
a frequency divider for frequency-dividing a frequency of an input frequency signal by an integer frequency division ratio applied; and
an arithmetic circuit for supplying an integer frequency division signal to said frequency divider upon receiving an input rational number defined by an integer value and a decimal value,
wherein said arithmetic circuit includes a plurality of cumulative adders which are cascade-connected in at least three stages and have an integral function, and
outputs the integer frequency division signal on the basis of the rational number defined by the integer value and the decimal value.

11. A rational frequency division device according to claim 10, wherein each of said cumulative adders has an adder for adding the input rational number or the output value from the cumulative adder of the previous stage and the feedback value and outputting the sum value, a subtracter for performing a substraction between an integer value of the output value from said adder and an integer feedback value output from said delay circuit and outputting the difference value, an intra-circuit delay circuit for synthesizing and delaying an integer output value from said subtracter and a decimal value of the output from said adder, and outputting the delayed value to said adder as a feedback value, and output means for synthesizing the integer output value from said subtracter and the decimal value of the output value from said adder and outputting the synthesized value as the output value to the cumulative adder of a next stage or said integer value extraction circuit.

12. A rational frequency division device according to claim 10, wherein said arithmetic circuit comprises at least three stages of cascade-connected cumulative adders.

13. A frequency synthesizer comprising:
a variable oscillator;
a frequency divider for frequency-dividing a frequency signal from said variable oscillator by an integer frequency division ratio in correspondence with a setting value;
a phase detector for detecting a phase difference between a reference signal and a frequency-divided signal from said frequency divider, and outputting a phase difference signal corresponding to the phase difference to said variable oscillator; and
an arithmetic circuit which has a plurality of integrators which are cascade-connected in at least three stages, performs a calculation upon receiving a rational number defined by an integer value and a decimal value, and sets the calculation result in said frequency divider, so that the frequency-divided signal output from said frequency divider includes a rational number frequency component if an average value is calculated, and an error frequency component which decreases toward a low-frequency region at a gradient of about 6×n (dB/octave), and
wherein the error frequency component is easily attenuated by a low-frequency characteristic of a loop constituted by said variable oscillator, said frequency divider, and said phase detector.

* * * * *